(12) United States Patent
Yamamoto et al.

(10) Patent No.: US 8,211,751 B2
(45) Date of Patent: Jul. 3, 2012

(54) SEMICONDUCTOR DEVICE AND METHOD OF MANUFACTURING THE SAME

(75) Inventors: Satoshi Yamamoto, Sakura (JP); Hirokazu Hashimoto, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/810,279

(22) PCT Filed: Dec. 12, 2008

(86) PCT No.: PCT/JP2008/072636
§ 371 (c)(1),
(2), (4) Date: Jun. 23, 2010

(87) PCT Pub. No.: WO2009/081763
PCT Pub. Date: Jul. 2, 2009

(65) Prior Publication Data
US 2010/0276765 A1    Nov. 4, 2010

(30) Foreign Application Priority Data
Dec. 25, 2007   (JP) ................................. 2007-331695

(51) Int. Cl.
*H01L 21/50* (2006.01)
(52) U.S. Cl. ................. 438/118; 257/E21.499
(58) Field of Classification Search ........................ None
See application file for complete search history.

(56) References Cited

U.S. PATENT DOCUMENTS
2005/0167795 A1 * 8/2005 Higashi .................. 257/678

FOREIGN PATENT DOCUMENTS
| JP | 2005-123561 A | 5/2005 |
| JP | 2005-228863 A | 8/2005 |
| JP | 2007-123444 A | 5/2007 |
| WO | 2006-035135 A1 | 4/2006 |

OTHER PUBLICATIONS

Tatsuya Ito, "Electronic Materials", Jan. 2007, 8 pages.
S. Yamamoto, et al., "Through-Hole Interconnection Technologies in Si Substrate for Wafer Level Package", ICEP 2006 Proceedings, pp. 259-264.
Notice of Reasons for Rejection, issued Feb. 28, 2012 by the Japanese Patent Office in counterpart Japanese Application No. 2009-518659.

* cited by examiner

*Primary Examiner* — Seahvosh Nikmanesh
(74) *Attorney, Agent, or Firm* — Sughrue Mion, PLLC

(57) ABSTRACT

A method of manufacturing a semiconductor device includes: a bonding step of bonding a first substrate with optical transparency and a second substrate having a surface on which a functional element is provided to each other such that the functional element faces the first substrate; a thinning step of thinning at least one of the first and second substrates; and a through-hole forming step of forming a cavity and a through-hole communicated with the cavity in at least part of a bonding portion between the first and second substrates. According to the present invention, it is possible to prevent irregularities or cracks caused by the presence or absence of the cavity and more regularly thin the substrate. In addition, it is possible to manufacture a semiconductor device capable of contributing to the miniaturization of devices and electronic equipment having the devices, using a more convenient process.

5 Claims, 4 Drawing Sheets

SEMICONDUCTOR DEVICE AND METHOD OF MANUFACTURING THE SAME

TECHNICAL FIELD

The present invention relates to a semiconductor device which allows for a package such as an image sensor or a MEMS (Micro Electro Mechanical System) device to be miniaturized and made thinner, and a method of manufacturing the same.

Priority is claimed on Japanese Patent Application No. 2007-331695, filed Dec. 25, 2007, the content of which is incorporated herein by reference.

BACKGROUND ART

With the increasing miniaturization and sophistication of electrical equipment such as mobile phones in recent years, it is demanded that the electronic devices used therein also be miniaturized. In order to meet these demands, it is indispensable to develop technologies for increasing the miniaturization and sophistication of device package, in addition to the miniaturization of the device itself. For technologies that achieve the miniaturization of the device package, various device packages employing a wafer-level package technology have been proposed, and it is expected that they will be applied to MEMS devices or image sensors (refer to Non-Patent Document 1).

For a package of a MEMS device or an image sensor device, it is necessary to provide a certain size of cavity in order to obtain space for driving micromachines or space for storing micro-lenses.

In the related art, as a method of forming the cavity in a wafer-level package, a method has been proposed, in which the substrates are bonded using previously patterned photosensitive resin as an adhesive, and the cavity is formed in a portion where the resin does not exist (refer to Non-Patent Document 2).

However, when a wafer-level package is manufactured using this method, since the thinning is performed by grinding the substrate after bonding in which the cavity is already formed, the weight applied during grinding is different between portions where the cavity is present and portions where the cavity is absent. Therefore, irregularities in the pattern depending on presence or absence of the cavity are generated on the surface of the substrate after the grinding. In some cases, a crack is generated in the substrates. This limits the thinning of the substrate.

[Non-Patent Document 1] Tatsuya ITO, "Electronic Materials," January 2007, p. 60-64

[Non-Patent Document 2] S. Yamamoto, et al., "ICEP2006 Proceedings," p. 259-264

DISCLOSURE OF THE INVENTION

Problems to be Solved by the Invention

The present invention was devised in view of the above circumstances, and has as a first object the provision of a method of manufacturing a semiconductor device capable of preventing irregularities or cracks caused by the presence or absence of the cavity after the grinding, more regularly thinning the substrate, and contributing to the miniaturization of devices and electronic equipment having the devices, using a more convenient process.

In addition, the present invention has as a second object the provision of a semiconductor device capable of preventing irregularities or cracks caused by the presence or absence of the cavity, more regularly thinning the substrate, and contributing to the miniaturization of devices and electronic equipment having the devices.

MEANS FOR SOLVING THE PROBLEMS

A method of manufacturing a semiconductor device according to the present invention includes: a bonding step of bonding a first substrate with optical transparency and a second substrate having a surface on which a functional element is provided to each other such that the functional element faces the first substrate; a thinning step of thinning at least one of the first and second substrates; and a through-hole forming step of forming a cavity and a through-hole communicated with the cavity in at least part of a bonding portion between the first and second substrates.

In the method of manufacturing a semiconductor device according to the present invention, it is preferable that, in the bonding step, the first and second substrates be bonded to each other by providing photosensitive resin in the bonding portion and curing the photosensitive resin by exposure, and in the through-hole forming step, the cavity be formed by removing a predetermined portion of the photosensitive resin after the curing.

In the method of manufacturing a semiconductor device according to the present invention, it is preferable that, in the through-hole forming step, the cavity be formed by irradiating the first substrate at a predetermined position with laser light to form a reforming portion, and removing the reforming portion.

In the method of manufacturing a semiconductor device according to the present invention, it is preferable to further include a sealing portion forming step of forming a sealing portion which air-tightly seals the cavity, after the through-hole forming step.

A semiconductor device according to the present invention includes: a first substrate with optical transparency; a second substrate which has a surface on which a functional element is provided and which is bonded to the first substrate such that the functional element faces the first substrate; a cavity arranged in a portion corresponding to the functional element at a bonding portion between the first and second substrates; and a through-hole communicated with the cavity.

In the semiconductor device according to the present invention, it is preferable that the functional element be an imaging element.

In the semiconductor device according to the present invention, it is preferable that the functional element be a pressure sensor element.

ADVANTAGEOUS EFFECTS OF THE INVENTION

According to the present invention, after the first and second substrates are bonded to each other, at least one of the substrates is thinned, and then, the cavity is formed. This makes it possible to prevent irregularities or cracks caused by the presence or absence of the cavity after the grinding, and therefore it is possible to more regularly and thinly grind the wafer. This also makes it possible to reduce the thickness of the package in comparison with that of the related art. As a result, according to the present invention, it is possible to provide a method of manufacturing a semiconductor device capable of contributing to the miniaturization of devices and electronic equipment having the devices, using a more convenient process.

In addition, according to the present invention, it is possible to prevent irregularities or cracks caused by the presence or absence of the cavity and more regularly thinning the substrate. This makes it possible to provide a semiconductor device capable of contributing to the miniaturization of devices and electronic equipment having the devices.

DESCRIPTION OF THE REFERENCE SYMBOLS 1A, 1B (1): SEMICONDUCTOR DEVICE
11, 21: FIRST SUBSTRATE
12, 22: SECOND SUBSTRATE
13, 23: FUNCTIONAL ELEMENT
14: PHOTOSENSITIVE RESIN
15, 24: CAVITY
16, 25: THROUGH-HOLE
17, 26: SEALING PORTION

BEST MODE FOR CARRING OUT THE INVENTION

Hereinafter, embodiments of a semiconductor device according to the present invention will be described with reference to the drawings.
<First Embodiment>
A first embodiment of the present invention will be described.

Figure 1:
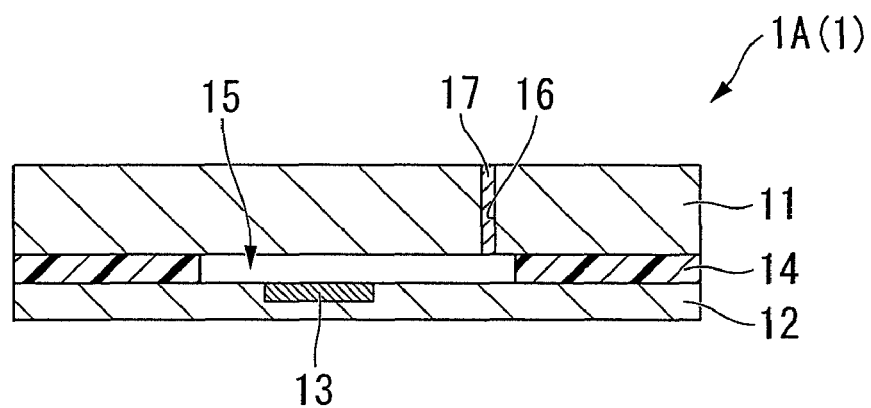
FIG. 1 is a cross-sectional view illustrating an example of a semiconductor device according to the present invention.

FIG. 1 is a schematic cross-sectional view illustrating an example of a semiconductor device according to the present invention.

The semiconductor device 1A(1) includes a first substrate 11 with optical transparency, a second substrate 12 which has a surface on which a functional element 13 is provided and which is bonded to the first substrate 11 such that the functional element 13 faces the first substrate 11, a cavity 15 arranged in a portion corresponding to the functional element 13 at a bonding portion between the first and second substrates 11 and 12, a through-hole 16 communicated with the cavity 15, and a sealing portion 17 for sealing the cavity 15 and the through-hole 16.

In the semiconductor device 1A, the first and second substrates 11 and 12 are bonded to each other by photosensitive resin 14.

In the semiconductor device 1A according to the present invention, the substrate is more regularly thinned without generating irregularities or cracks caused by the presence or absence of the cavity. This makes it possible to contribute to the miniaturization of devices and electronic equipment having the devices.

Examples of the first substrate 11 include, but not limited thereto, a transparent substrate made of glass, semiconductor such as silicon, single crystal of sapphire or the like, resin, and a composite material thereof. Particularly, in order to allow the semiconductor device 1A to be used in an image sensor package, the first substrate 11 is preferably made of a glass substrate which is transparent within the visible light range (e.g., Pyrex (Registered Trademark)). The thickness of the first substrate 11 is preferably about 150 μm to 1 mm, but not limited thereto.

The second substrate 12 is made of, for example, a semiconductor substrate. Examples of the semiconductor substrate include a semiconductor wafer such as a silicon wafer and a semiconductor chip obtained by dicing a semiconductor wafer by a chip size.

The functional element 13 is mounted on the top surface of the second substrate 12. Although not shown in the drawing, the second substrate 12 is provided with a boron diffusion layer for electrically connecting the functional element 13 to an external electronic circuit or the like, a penetration electrode provided to pass through the top surface and the back surface of the second substrate 12, and the like.

In the present embodiment, the functional element 13 is an imaging element such as a CCD or a pressure sensor element.

In addition, another examples of the functional element 13 include an IC chip, an optical element, a micro-relay, a micro-switch, an accelerometer, a high-frequency filter, a micro-mirror, a micro-reactor, a μ-TAS, a DNA chip, a MEMS device, and a micro-fuel battery.

Next, a method of manufacturing the semiconductor device 1A will be described.

A method of manufacturing a semiconductor device according to the present invention includes a step a of bonding the first substrate 11 with optical transparency and the second substrate 12 having the surface on which the functional element 13 is provided such that the functional element 13 faces the first substrate 11, a step β of thinning at least one of the first substrate 11 and the second substrate 12 (in this case, the second substrate 12), and a step γ of forming the cavity 15 in at least part of a bonding portion between the first and second substrates 11 and 12 and the through-hole 16 communicated with the cavity 15, in this order.

According to the present invention, after the first and second substrates 11 and 12 are bonded to each other, one of the substrates is thinned, and thereafter, the cavity 15 is formed.

As a result, it is possible to prevent irregularities or cracks caused by the presence or absence of the cavity 15 after the grinding, and therefore it is possible to more regularly and thinly grind the substrate.

This makes it possible to reduce the thickness of the package in comparison with that of the related art. As a result, according to the present invention, it is possible to manufacture a semiconductor device capable of contributing to the miniaturization of devices and electronic equipment having the devices using a more convenient process.

FIGS. 2A to 2E are schematic cross-sectional views illustrating each step in the manufacturing method according to the present embodiment.

Hereinafter, each step will be described in detail. In addition, while specific examples are described below, the present invention is not limited thereto.

Figure 2A:
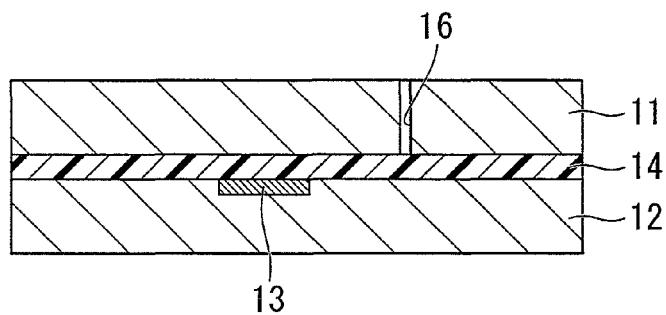
FIG. 2A is a cross-sectional view illustrating a process sequence for a method of manufacturing the semiconductor device shown in FIG. 1.

(1) First, as shown in FIG. 2A, the first substrate 11 with optical transparency and the second substrate 12 having the surface on which the functional element 13 is provided are bonded to each other such that the functional element 13 faces the first substrate 11 (in step α).

In the present embodiment, the first substrate 11 and the second substrate 12 are bonded to each other by supplying the photosensitive resin 14 in a bonding portion between the first substrate 11 and the second substrate 12, and then exposing and curing it in the subsequent step.

As the first substrate 11, a glass substrate transparent within the visible light range (e.g., Pyrex (Registered Trademark), 4 inches, a thickness of 500 μm) is used in order to allow it to be applied to an image sensor package as well.

As the second substrate 12, a Si substrate (4 inches, a thickness of 525 μm) having a MEMS device or an image sensor on one surface as the functional element 13 is used.

In addition, in the first substrate 11, the single through-hole 16 is previously formed at a portion where the cavity 15 is formed.

Examples of the photosensitive resin 14 include polyimide resin, epoxy resin, and silicon resin, but not limited thereto.

Examples of the method of coating the resin include stamping, dispensing, spin-coating, and spray-coating, but not limited thereto.

In this case, negative-type photosensitive resin, in which exposed portions are cured, is used as the photosensitive resin 14.

Figure 2B:
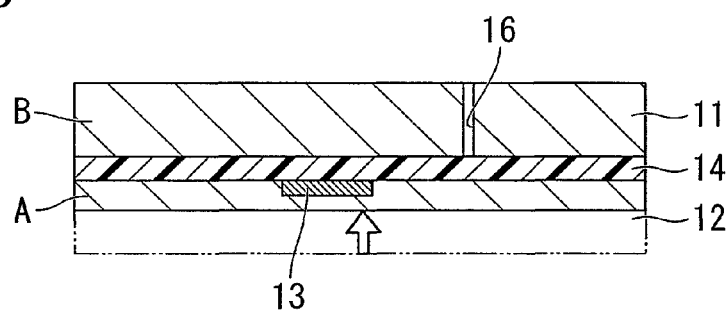
FIG. 2B is a cross-sectional view illustrating a process sequence for a method of manufacturing the semiconductor device shown in FIG. 1.

(2) Next, as shown in FIG. 2B, at least one of the first substrate 11 and the second substrate 12 is thinned (in step β).

After the first substrate 11 and the second substrate 12 are bonded to each other, the second substrate 12 is thinned by grinding. In the present embodiment, the thickness of the second substrate 12 is reduced to 100 μm by mechanically grinding and then polishing the second substrate 12 (i.e., the Si substrate).

Figure 2C:
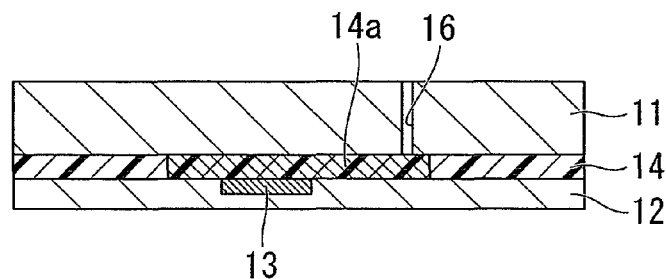
FIG. 2C is a cross-sectional view illustrating a process sequence for a method of manufacturing the semiconductor device shown in FIG. 1.

(3) Next, as shown in FIG. 2C, the cavity 15 is formed in at least part of the bonding portion between the first and second substrates 11 and 12 (in step γ). As a result, the through-hole 16 previously provided is communicated with the cavity 15.

Here, in the present embodiment, the cavity 15 is formed by removing the photosensitive resin 14 at a predetermined part after curing.

First, the photosensitive resin 14 is exposed and cured by irradiating the photosensitive resin 14 with light from the first substrate 11 side. In this case, part of the photosensitive resin 14 corresponding to the cavity 15 (shown as an unexposed portion 14a in the drawing) is not exposed in order to remove the part by a chemical liquid in the subsequent step. This makes it possible to use this portion as the cavity 15. Since the first substrate 11 is made of glass, light illuminated from the first substrate 11 side can be transmit through the first substrate 11 to expose the photosensitive resin 14.

Figure 2D:
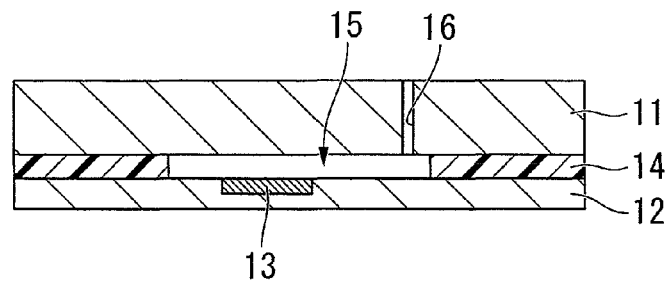
FIG. 2D is a cross-sectional view illustrating a process sequence for a method of manufacturing the semiconductor device shown in FIG. 1.

Next, as shown in FIG. 2D, the resin of the unexposed portion 14a is removed by the chemical liquid to form the cavity 15. In this case, in order to introduce the chemical liquid into the unexposed portion 14a, the through-hole 16 formed in the first substrate 11 is used. This through-hole 16 may be previously formed in the first substrate 11 or newly formed after bonding the substrates.

Figure 2E:
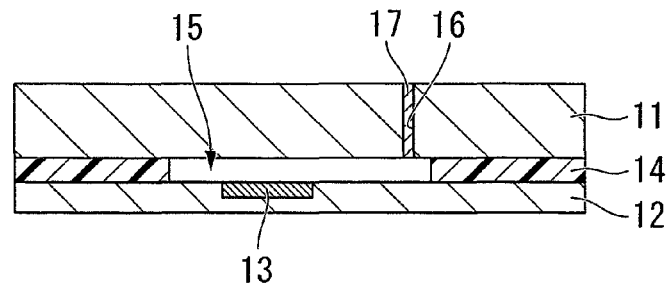
FIG. 2E is a cross-sectional view illustrating a process sequence for a method of manufacturing the semiconductor device shown in FIG. 1.

(5) Next, as shown in FIG. 2E, a sealing portion 17 for air-tightly sealing the cavity 15 is formed (in step δ).

After forming the cavity 15, the through-hole 16 may be occluded by the sealing portion 17 made of glass having a low melting point, resin, and the like. This makes it possible to air-tightly seal the cavity 15. In addition, when the second substrate 12 on the cavity 15, which has been thinned by grinding, is used as a flexible diaphragm, a new function such as pressure sensing can be added.

Through the aforementioned steps, it is possible to obtain the semiconductor device 1A shown in FIG. 1.

In the semiconductor device 1A obtained as described above, it is possible to prevent irregularities or cracks caused by the presence or absence of the cavity and more regularly thin the substrate. This makes it possible to contribute to the miniaturization of devices and electronic equipment having the devices.

In addition, the material of the first and second substrates 11 and 12 are not limited to the present embodiment, and they may be Pyrex (Registered Trademark) substrates or may be a substrate made of other glass and an Si wafer. The thicknesses of the first and second substrates 11 and 12 may be appropriately set within a range of 150 μm to 1 mm. The photosensitive resin 14 may be a positive type by which the exposed portion is removed by the chemical liquid. Furthermore, the number of through-holes 16 for introducing the chemical liquid may be greater than 1.

<Second Embodiment>

Next, a second embodiment of the present invention will be described.

Figure 3:
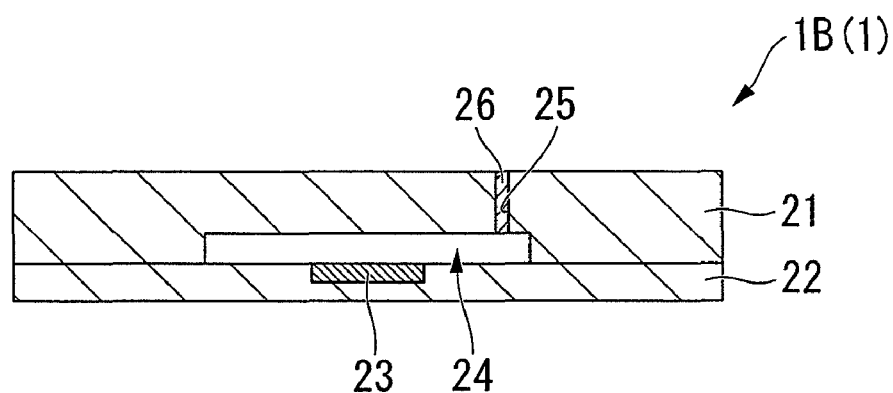
FIG. 3 is a schematic cross-sectional view illustrating another example of a semiconductor device according to the present invention.

FIG. 3 is a schematic cross-sectional view illustrating another example of a semiconductor device according to the present embodiment.

The semiconductor device 1B(1) includes a first substrate 21 with optical transparency, a second substrate 22 which has a surface on which a functional element 23 is provided and which is bonded to the first substrate 21 such that the functional element 23 faces the first substrate 21, a cavity 24 arranged in a portion corresponding to the functional element 23 at a bonding portion between the first and second substrates 21 and 22, a through-hole 25 communicated with the cavity 24, and a sealing portion 26 for sealing the cavity 24 and the through-hole 25.

In the semiconductor device 1B according to the present invention, it is possible to prevent irregularities or cracks caused by the presence or absence of the cavity 24 and more regularly thin the substrate. This makes it possible to contribute to the miniaturization of devices and electronic equipment having the devices.

The first substrate 21, the second substrate 22, and the functional element 23 may be substituted with the first substrate 11, the second substrate 12, and the functional element 13 described above.

Next, a method of manufacturing the semiconductor device 1B will be described.

The method of manufacturing the semiconductor device according to the present invention includes a step a of bonding the first substrate 21 with optical transparency and the second substrate 22 having the surface on which the functional element 23 is provided such that the functional element 23 faces the first substrate 21, a step β of thinning at least one of the first and second substrates 21 and 22 (in this case, the second substrate 22), and a step γ of forming the cavity 24 in at least part of the bonding portion between the first and second substrates 21 and 22 and the through-hole 25 communicated with the cavity 24, in this order.

According to the present invention, after bonding the first and second substrates 21 and 22, one of the substrates is thinned, and then the cavity 24 is formed. This makes it possible to prevent irregularities or cracks caused by the presence or absence of the cavity 24 after grinding, and therefore it is possible to more regularly and thinly grind the wafer. This also makes it possible to reduce the thickness of the package to be thinner than that of the related art.

As a result, it is possible to manufacture the semiconductor device capable of contributing to the miniaturization of devices and electronic equipment having the devices using a more convenient process.

FIGS. 4A to 4E are schematic cross-sectional views illustrating each step of the manufacturing method according to the present invention.

Hereinafter, each step will be described in detail. In addition, while specific examples are described below, the present invention is not limited thereto.

Figure 4A:
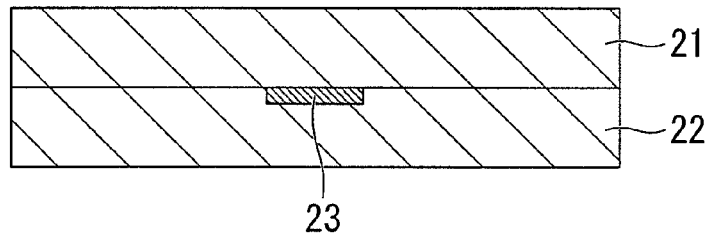
FIG. 4A is a cross-sectional view illustrating a process sequence for a method of manufacturing the semiconductor device shown in FIG. 3.

(1) First, as shown in FIG. 4A, the first substrate 21 with optical transparency and the second substrate 22 having the surface on which the functional element 23 is provided are bonded to each other such that the functional element 23 faces the first substrate 21 (in step α).

First, the first and second substrates 21 and 22 are bonded to each other. In the present embodiment, a Pyrex (Registered Trademark) glass substrate (4 inches, a thickness of 500 μm) is used as the first substrate 21, an Si substrate (4 inches, a thickness of 525 μm), which has a surface on which a MEMS device or an image sensor employed as the functional element 23 is provided, is used as the second substrate 22, and both substrates are bonded by an anodic bonding.

Figure 4B:
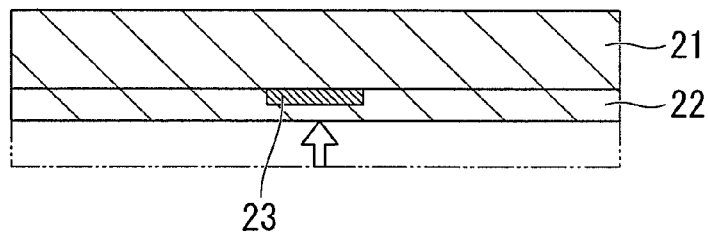
FIG. 4B is a cross-sectional view illustrating a process sequence for a method of manufacturing the semiconductor device shown in FIG. 3.

(2) Next, as shown in FIG. 4B, at least one of the first and second substrates 21 and 22 is thinned (in step β).

After bonding the first and second substrates 21 and 22, the second substrate 22 is thinned by grinding. In the present embodiment, the thickness of the second substrate 22 is reduced to 100 μm by mechanically grinding and then polishing the second substrate 22.

Figure 4C:
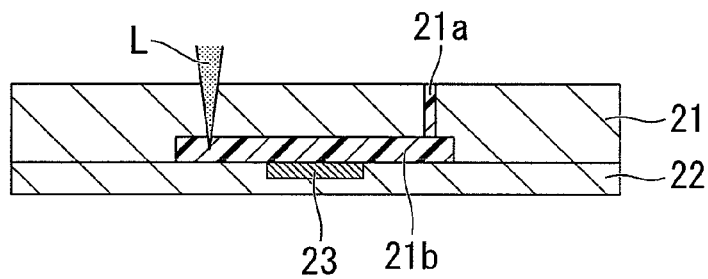
FIG. 4C is a cross-sectional view illustrating a process sequence for a method of manufacturing the semiconductor device shown in FIG. 3.

(3) Next, as shown in FIG. 4C, the cavity 24 and the through-hole 25 communicated with the cavity 24 are formed in at least part of the bonding portion between the first and second substrates 21 and 22 (in step γ).

In the present embodiment, reforming portions 21a and 21b are formed by irradiating the first substrate 21 at a predetermined position with laser light L, and then the through-hole 25 and the cavity 24 are formed by removing the reforming portions 21a and 21b.

Proximity of the bonding interface between the first and second substrates 21 and 22 is reformed by the laser light L. In the present embodiment, first, the reforming portion 21a is formed in a direction perpendicular to the surface of the first substrate 21, i.e., the Pyrex (Registered Trademark) glass. Then, the reforming portion 21b is formed by reforming the Pyrex (Registered Trademark) glass at the proximity of the bonding interface according to the desired size of the cavity 24. In the present embodiment, the femtosecond laser (having an average output power of 800 mW, a pulse width of 250 fs, a repetition frequency of 2 kHz, and a wavelength of 800 nm) is used as the laser light L, and the reforming portions 21a and 21b are formed by concentrating the light inside the Pyrex (Registered Trademark) glass and irradiating the inside of the glass with the light.

Figure 4D:
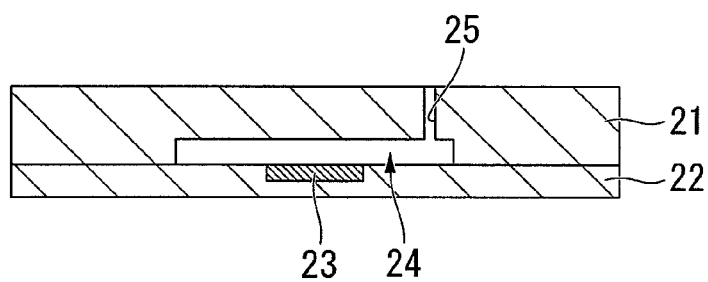
FIG. 4D is a cross-sectional view illustrating a process sequence for a method of manufacturing the semiconductor device shown in FIG. 3.

Furthermore, as shown in FIG. 4D, the reforming portions 21a and 21b are etched using a chemical liquid to form the cavity 24 and the through-hole 25. In this case, since the reforming portions 21a and 21b are more rapidly etched in comparison with the unreformed portions, the cavity 24 and the through-hole 25 can be formed as a result.

Figure 4E:
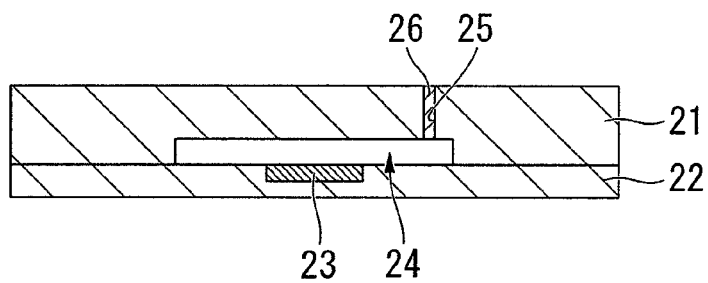
FIG. 4E is a cross-sectional view illustrating a process sequence for a method of manufacturing the semiconductor device shown in FIG. 3.

(5) Next, as shown in FIG. 4E, the sealing portion 26 for air-tightly sealing the cavity 24 is formed (in step δ).

After forming the cavity 24, the through-hole 25 may be occluded using a sealing portion 26 made of glass having a low melting point, resin, and the like. This makes it possible to air-tightly seal the cavity 24. In addition, when the first substrate 21 on the cavity 24, which has been thinned by grinding, is used as a flexible diaphragm, a new function such as pressure sensing can be added.

Through the aforementioned steps, it is possible to obtain the semiconductor device 1B shown in FIG. 3.

In the semiconductor device 1B obtained through the aforementioned steps, it is possible to prevent irregularities or cracks caused by the presence or absence of the cavity and more regularly thin the substrate. This makes it possible to contribute to the miniaturization of devices and electronic equipment having the devices.

In addition, the material of the first and second substrates 21 and 22 are not limited to the present embodiment, and they may be Pyrex (Registered Trademark) substrates or may be a substrate made of other glass and an Si wafer. In this case, the wavelength of the laser light L is appropriately set so as to transmit through the substrate. In addition, the thicknesses may also be appropriately set to 150 μm to 1 mm. The bonding method is not limited to the anodic bonding, but may include a room-temperature bonding or an adhesive bonding. Furthermore, the number of vertically-arranged reforming portions may be greater than 1.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

The present invention can be widely applicable to a semiconductor device having a cavity and a method of manufacturing the same.

The invention claimed is:

1. A method of manufacturing a semiconductor device comprising:
   a bonding step of bonding a first substrate with optical transparency and a second substrate having a surface on which a functional element is provided to each other such that the functional element faces the first substrate;
   a thinning step of thinning at least one of the first and second substrates after the bonding step; and
   a through-hole forming step of forming a though-hole and a cavity communicated with the through-hole in at least part of a bonding portion between the first and second substrates, wherein
   the cavity is formed by introducing a chemical liquid into the through-hole.

2. The method according to claim 1, further comprising a sealing portion forming step of forming a sealing portion which air-tightly seals the cavity, after the through-hole forming step.

3. The method according to claim 1, wherein the though-hole forming step is performed after the bonding step.

4. A method of manufacturing a semiconductor device comprising:
- a bonding step of bonding a first substrate with optical transparency and a second substrate having a surface on which a functional element is provided to each other such that the functional element faces the first substrate;
- a thinning step of thinning at least one of the first and second substrates; and
- a through-hole forming step of forming a cavity and a through-hole communicated with the cavity in at least part of a bonding portion between the first and second substrates;

wherein:
in the bonding step, the first and second substrates are bonded to each other by providing photosensitive resin in the bonding portion and curing the photosensitive resin by exposure, and
in the through-hole forming step, the cavity is formed by removing a predetermined portion of the photosensitive resin after the curing.

5. A method of manufacturing a semiconductor device comprising:
- a bonding step of bonding a first substrate with optical transparency and a second substrate having a surface on which a functional element is provided to each other such that the functional element faces the first substrate;
- a thinning step of thinning at least one of the first and second substrates; and
- a through-hole forming step of forming a cavity and a through-hole communicated with the cavity in at least part of a bonding portion between the first and second substrates;

wherein
in the through-hole forming step, the cavity is formed by irradiating the first substrate at a predetermined position with laser light to form a reforming portion, and removing the reforming portion.

* * * * *